(12) United States Patent
Yamamoto

(10) Patent No.: US 10,043,881 B2
(45) Date of Patent: Aug. 7, 2018

(54) SEMICONDUCTOR DEVICE AND METHOD OF MANUFACTURING THE SAME

(71) Applicant: RENESAS ELECTRONICS CORPORATION, Kawasaki-shi, Kanagawa (JP)

(72) Inventor: Yoshiki Yamamoto, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 5 days.

(21) Appl. No.: 14/795,839

(22) Filed: Jul. 9, 2015

(65) Prior Publication Data

US 2016/0013287 A1 Jan. 14, 2016

(30) Foreign Application Priority Data

Jul. 9, 2014 (JP) ................................ 2014-141814

(51) Int. Cl.
| | |
|---|---|
| *H01L 29/49* | (2006.01) |
| *H01L 21/84* | (2006.01) |
| *H01L 29/51* | (2006.01) |
| *H01L 27/12* | (2006.01) |
| *H01L 29/06* | (2006.01) |

(52) U.S. Cl.
CPC .......... *H01L 29/4933* (2013.01); *H01L 21/84* (2013.01); *H01L 27/1203* (2013.01); *H01L 29/0607* (2013.01); *H01L 29/511* (2013.01)

(58) Field of Classification Search
CPC .................................................. H01L 29/511
See application file for complete search history.

(56) References Cited

U.S. PATENT DOCUMENTS

| | | | | |
|---|---|---|---|---|
| 2006/0267116 A1* | 11/2006 | Shimamoto | ....... | H01L 21/28202 257/411 |
| 2012/0138953 A1* | 6/2012 | Cai | ................. | H01L 21/823807 257/77 |
| 2013/0087859 A1* | 4/2013 | Liang | .................... | H01L 27/092 257/369 |
| 2014/0042529 A1 | 2/2014 | Yamamoto et al. | | |

FOREIGN PATENT DOCUMENTS

| | | |
|---|---|---|
| JP | 56-049561 A | 5/1981 |
| JP | 04-177873 A | 6/1992 |
| JP | 2004-146550 A | 5/2004 |
| JP | 2013-191760 A | 9/2013 |
| JP | 2014-038878 A | 2/2014 |

OTHER PUBLICATIONS

Office Action, dated Apr. 3, 2018, in Japanese Patent Application No. 2014-141814.

* cited by examiner

*Primary Examiner* — Daniel Whalen
(74) *Attorney, Agent, or Firm* — Shapiro, Gabor and Rosenberger, PLLC

(57) ABSTRACT

While increasing a threshold voltage of a MOSFET configuring a CMOS, electric power saving of elements is achieved by suppressing excessive increase in the threshold voltage, and occurrence of performance variation among the elements is suppressed. A gate electrode of an NMOS is made of a P-type semiconductor film, a high-permittivity film is provided in a gate insulating film of the NMOS, and an impurity is prevented from being introduced into a channel region of the NMOS. Moreover, a high-permittivity film is provided also in a gate insulating film of a PMOS.

14 Claims, 11 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. 2014-141814 filed on Jul. 9, 2014, the content of which is hereby incorporated by reference into this application.

TECHNICAL FIELD OF THE INVENTION

The present invention relates to a semiconductor device and a method of manufacturing the same. More particularly, the present invention relates to a technique effectively applied to a semiconductor device having a SOI (Silicon On Insulator) substrate and a method of manufacturing the same.

BACKGROUND OF THE INVENTION

As a semiconductor device which can suppress short-channel characteristics and suppress element variations, a semiconductor device using a SOI substrate is used in these days. The SOI substrate is a substrate obtained by forming a BOX (Buried Oxide) film (embedded oxide film) on a supporting substrate made of high-resistance Si (silicon) or others, and forming a thin layer (silicon layer, SOI layer) mainly containing Si (silicon) on the BOX film. If a MOSFET (Metal Oxide Semiconductor Field Effect Transistor: MOS-type field effect transistor) is formed on the SOI substrate, the short-channel characteristics can be suppressed without introducing an impurity into a channel layer. As a result, mobility can be improved, and element variations due to impurity fluctuation can be improved. Therefore, by manufacturing a semiconductor device using the SOI substrate, improvement in the integration density and operating speed of the semiconductor device and improvement in an operating margin caused by reduction in variations can be expected.

Patent Document 1 (Japanese Patent Application Laid-Open Publication No. 2004-146550) describes that a gate electrode of an N-channel-type MOSFET on a SOI substrate is made of a P-type semiconductor film. There is no description about a P-channel-type MOSFET therein, and the document describes that the film thickness of the gate electrode is about 200 nm.

SUMMARY OF THE INVENTION

In the N-channel-type MOSFET, in order to prevent occurrence of a leak current in an off state, it is conceivable to increase the work function of the gate and increase the threshold voltage thereof by employing the P type as the conduction type of the gate electrode as described in the Patent Document 1. However, in this case, the threshold voltage of the N-channel-type MOSFET is excessively increased, and therefore, there is a problem that a high power-supply voltage is required in order to operate the MOSFET.

The other object and novel characteristics will be apparent from the description of the present specification and the accompanying drawings.

The typical ones of the embodiments disclosed in the present application will be briefly described as follows.

In a semiconductor device according to an embodiment, a high-permittivity film is provided in a gate insulating film of an NMOS having a P-type gate electrode, and a SOI layer of a channel region is made of an intrinsic semiconductor layer.

Moreover, a method of manufacturing the semiconductor device according to an embodiment is for maintaining the conduction type of the gate electrode at the P type by providing the high-permittivity film in the gate insulating film, forming the gate electrode of the NMOS by a P-type semiconductor film, and then, preventing an N-type impurity from being introduced into the gate electrode in a step of forming source/drain regions of the NMOS.

According to an embodiment disclosed in the present application, the performance of the semiconductor device can be improved. Particularly, the leak current in the off state of the MOSFET can be reduced, and electric power of the MOSFET can be saved.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout all the drawings for describing the embodiments, and the repetitive description thereof will be omitted. Also, in the following embodiments, the description of the same or similar parts is not repeated in principle unless otherwise it is particularly required.

In the present application, a substrate including a semiconductor substrate and a BOX film and a semiconductor layer sequentially stacked thereon is referred to as a SOI substrate. The semiconductor layer on the BOX film is referred to as a SOI layer in some cases. An N-channel MOSFET and a P-channel MOSFET are simply referred to as NMOS and PMOS, respectively, in some cases.

The present embodiment explains improvement of a performance of a MOSFET (MOS-type field-effect transistor) by configuring an NMOS gate electrode by a P-type semiconductor film and forming a gate insulating film including a high-permittivity film in a case in which CMOS (Complementary Metal Oxide Semiconductor) is formed on the SOI substrate.

Figure 1:
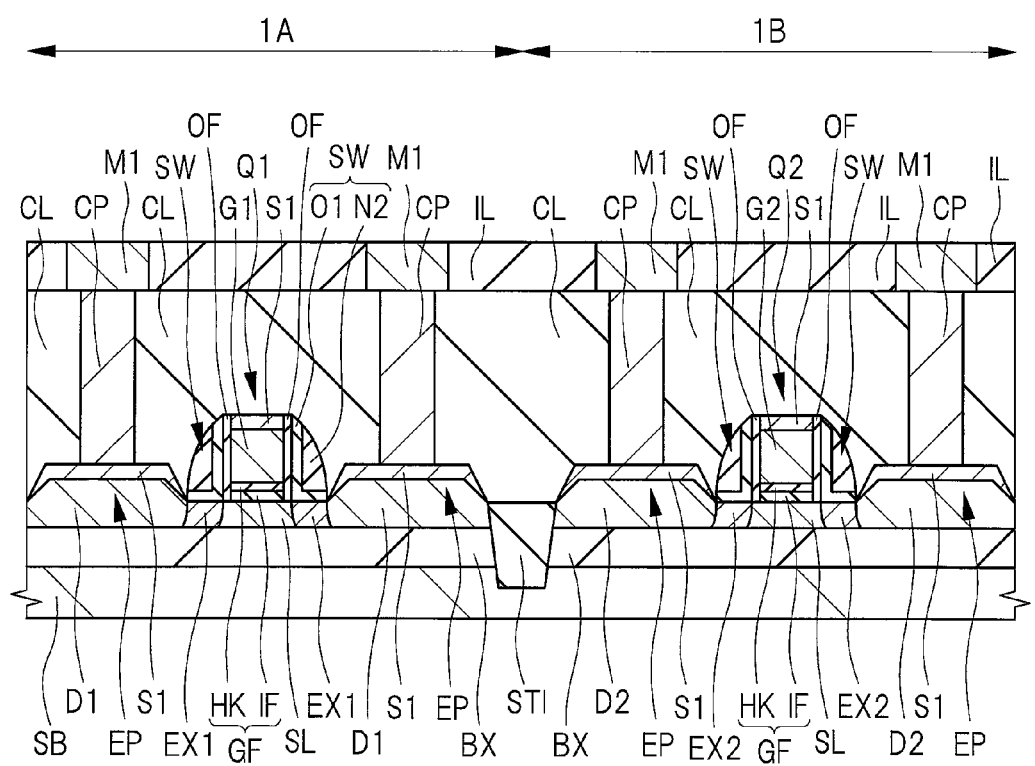
FIG. 1 is a cross-sectional view showing a semiconductor device according to an embodiment of the present invention.

Hereinafter, the structure of the CMOS on the SOI substrate in the present embodiment will be explained by using FIG. 1. FIG. 1 is a cross-sectional view of the CMOS configuring a semiconductor device of the present embodiment. FIG. 1 shows an NMOS region (first region) 1A on the left side of the drawing and a PMOS region (second region) 1B on the right side of the drawing. The NMOS region 1A and the PMOS region 1B are two regions arranged along a principal surface of the SOI substrate.

As shown in FIG. 1, the semiconductor device of the present embodiment has a SOI substrate made of: a semiconductor substrate SB which is a supporting substrate; a BOX film BX on the semiconductor substrate SB; and a SOI layer SL which is a semiconductor layer on the BOX film BX. The semiconductor substrate SB is a single-crystal silicon substrate having a thickness of, for example, about 500 μm to 700 μm and having high resistance of, for example, 750 Ωcm or larger.

The BOX film BX is made of, for example, a silicon oxide film, and the film thickness thereof is 5 to 100 nm. Here, the film thickness of the BOX film BX is 50 nm. The SOI layer SL is a semiconductor layer made of single-crystal silicon, and the film thickness thereof is 3 to 15 nm. Here, the film thickness of the SOI layer SL is 15 nm. The semiconductor substrate SB may be connected to a ground potential. Note that a potential different from that of a source electrode of an NMOS Q1 or a source electrode of a PMOS Q2 is supplied to the semiconductor substrate SB.

The NMOS Q1 is formed in the NMOS region 1A on the SOI substrate, and the PMOS Q2 is formed in the PMOS region 1B. A trench is formed on the upper surface of the SOI substrate at the boundary between the NMOS region 1A and the PMOS region 1B, and an element isolation region STI which electrically separates the NMOS Q1 and the PMOS Q2 from each other is formed in the trench. The NMOS Q1 has a gate electrode G1, which is formed on the SOI layer SL via a gate insulating film GF. The gate insulating film GF is made of an insulating film IF and a high-permittivity film HK, which are sequentially stacked on the SOI layer SL. Each of lateral walls on both sides of the gate electrode G1 is covered by a sidewall SW, which is formed thereon via an offset spacer OF.

The insulating film IF is made of, for example, a silicon oxynitride (SiON) film. The high-permittivity film HK is an insulating film having a higher permittivity than those of a silicon oxide ($SiO_2$) film and a silicon oxynitride film, and is, for example, a high-k film which contains a material having a high permittivity such as $HfO_2$, HfON or HFSiON. The concentration of Hf (hafnium) per unit area of the surface of the high-permittivity film HK is, for example, $1 \times 10^{13}$ to $5 \times 10^{14}/cm^2$. However, the material configuring the high-permittivity film HK is not a Hf (hafnium) compound or an Al (aluminum) compound.

The gate electrode G1 is made of, for example, a P-type semiconductor film made of a polysilicon (Si) film. Thus, a P-type impurity (for example, B (boron)) is introduced into the gate electrode G1. The height of the gate electrode G1 in the direction perpendicular to the principal surface of the SOI substrate, that is, the film thickness of the gate electrode G1 is 150 nm or smaller. Here, the height of the gate electrode G1 is, for example, 100 nm. The offset spacer OF is in contact with the lateral walls of the gate insulating film GF and the gate electrode G1, and is made of, for example, a silicon nitride ($Si_3N_4$) film. The element isolation region STI has, for example, a STI (Shallow Trench Isolation) structure, and is mainly made of, for example, a silicon oxide film. The element isolation region STI reaches an intermediate depth of the semiconductor substrate SB from the upper surface of the SOI layer SL. Note that the formation depth of the element isolation region STI from the upper surface of the SOI layer SL may be down to the upper surface of the BOX film BX.

The sidewall SW is an insulating film, which is formed in self alignment next to the gate electrode G1, and is made of, for example, a stacking layer film of a silicon oxide film O1 and a silicon nitride film N2 thereon. That is, the silicon oxide film O1 configuring the sidewall SW extends to be in contact with each of the lateral wall of the offset spacer OF and the upper surface of the SOI layer SL. That is, the silicon oxide film O1 is a film obtained by integrating the part along the lateral wall of the offset spacer OF and the part along the upper surface of the SOI layer SL, the film having an L-shaped cross-sectional surface. The film thickness of the silicon oxide film O1 is, for example, 5 nm, and the film thickness of the silicon nitride film N2 in the direction along the upper surface of the SOI substrate, that is, a lateral direction is, for example, 40 nm. Thus, the thickness of the sidewall SW in the lateral direction is, for example, 45 nm.

The SOI layer SL formed immediately below the gate electrode G1, that is, a silicon layer is a channel layer including a channel region in which current flows when the NMOS Q1 is driven. A pair of source/drain regions is formed in the SOI layer SL next to the gate electrode G1 so as to sandwich the channel region. Each of the pair of source/drain regions has: an extension region EX1 which is an N-type semiconductor region having a comparatively low impurity concentration; and a diffusion region D1 which is an N-type semiconductor region having a higher impurity concentration than that of the extension region EX1. In this manner, the source/drain region has a LDD (Lightly Doped Drain) structure including high-concentration and low-concentration impurity diffusion regions.

An impurity of an N-type, that is, a second conduction type (for example, P (phosphorous) or As (arsenic)) is implanted into the extension region EX1 and the diffusion region D1. The extension region EX1 is formed at a position closer to the above-described channel region than the diffusion region D1. That is, the formation position of the extension region EX1 is closer to the gate electrode G1 than the formation position of the diffusion region D1. Below the gate electrode G1, an N-type or P-type impurity is hardly introduced into the SOI layer SL in the region sandwiched between the opposed extension regions EX1. That is, the SOI layer SL is an intrinsic semiconductor layer. Even if a P-type impurity is introduced into the SOI layer SL, the impurity concentration thereof is $1 \times 10^{17}/cm^3$ or lower.

In FIG. 1, note that the extension region EX1 is formed from the upper surface of the SOI layer SL to the lower surface thereof. That is, each of the NMOS Q1 and PMOS Q2 shown in FIG. 1 is a completely (fully)-depleted-type MOSFET. On the other hand, the formation depth of the extension region EX1 may be down to an intermediate depth of the SOI layer SL. Similarly, in FIG. 1, while the diffusion region D1 is formed to reach the lower surface of the SOI layer SL, the formation depth of the diffusion region D1 may be down to an intermediate depth of the SOI layer SL.

A pair of epitaxial layers EP deposited by an epitaxial growth method is formed on the SOI layer SL, which is exposed from the gate insulating film GF, the gate electrode G1, the offset spacers OF, the sidewalls SW, and the element isolation region STI, so as to sandwich the gate electrode G1. Also in the epitaxial layers EP, an N-type impurity having a high concentration is implanted, so that the diffusion regions D1 are formed. A silicide layer S1 is formed on the upper surface of the epitaxial layer EP and the upper surface of the gate electrode G1. The silicide layer S1 is made of, for example, CoSi (cobalt silicide).

That is, the epitaxial layers EP configure the source/drain regions of the NMOS Q1. An object of the formation of the epitaxial layer EP is to prevent the silicidation of the entire film thickness of the thin SOI layer SL when, for example, the silicide layer S1 is formed on the upper surfaces of the source/drain regions. The distance from the upper surface of the SOI layer SL to the upper surface of the epitaxial layer EP in the direction perpendicular to the upper surface of the SOI substrate, that is, the height of the epitaxial layer EP is, for example, 20 to 40 nm.

In the NMOS region 1A, the gate insulating film GF including the high-permittivity film HK, the gate electrode, the above-described source/drain regions, and the SOI layer SL serving as the channel region configure an N-channel-type MOSFET, that is, the NMOS Q1.

The P-channel-type MOSFET formed in the PMOS region 1B, that is, the PMOS Q2 also has a structure almost the same as that of the above-described NMOS Q1. However, since the PMOS Q2 is a MOSFET of the P type which is different from the N type, the source/drain regions thereof is configured of semiconductor regions of the P type, that is, a first conduction type.

That is, in the PMOS region 1B, the gate insulating film GF including the high-permittivity film HK is formed on the SOI layer SL which is the intrinsic semiconductor layer, and a gate electrode G2 which is a semiconductor film into which a P-type impurity (for example, (B (boron)) is introduced is formed on the gate insulating film GF. The film thickness of the gate electrode G2 is 150 nm or smaller, and the gate electrode G2 has a film thickness of, for example, 100 nm.

In each of the both sides of the gate electrode G2, an offset spacer OF and a sidewall SW are sequentially formed. Moreover, in the SOI layer SL below the gate electrode G2, extension regions EX2 which are a pair of P-type semiconductor regions are formed so as to sandwich the region in the SOI layer SL immediately below the gate electrode G2, that is, the channel region. Moreover, in the PMOS region 1B, a pair of epitaxial layers EP is formed so as to sandwich the gate electrode G2 therebetween on the SOI layer SL which is exposed from the gate insulating film GF, the offset spacer OF, the sidewalls SW, and the element isolation region STI. In the epitaxial layers EP and in the SOI layer SL immediately below the epitaxial layers, diffusion regions D2, which are P-type semiconductor regions, are formed.

That is, the PMOS Q2 has a LDD structure including the pair of extension regions EX2 and the pair of diffusion regions D2 which have a higher P-type impurity concentration than that of the extension regions EX2. Note that the diffusion regions D1 and D2 may be formed only in the epitaxial layers EP and may be not formed in the SOI layer SL formed immediately below the epitaxial layers. Moreover, the silicide layer S1 is formed on the upper surfaces of the epitaxial layers EP and the upper surface of the gate electrode G2.

As described above, the NMOS Q1 and the PMOS Q2 have the same shapes including the point that the high-permittivity film HK is included in the gate insulating film GF includes. Moreover, each of the gate electrodes G1 and G2 is similarly made of a P-type semiconductor film. That is, the PMOS Q2 and the NMOS Q1 are different from each other in that the N-type impurity is introduced into the epitaxial layers EP and the diffusion regions D1 and that the P-type impurity is introduced into the epitaxial layers EP and the diffusion regions D2.

An interlayer insulating film CL is formed on the SOI substrate so as to cover the NMOS Q1 and the PMOS Q2. Moreover, a plurality of contact holes are formed so as to penetrate through the interlayer insulating film CL, and contact plugs CP are buried inside the plurality of contact holes, respectively. The interlayer insulating film CL is made of, for example, a silicon oxide film, and the upper surface thereof is planarized at the height which is the same as those of the upper surfaces of the contact plugs CP.

The contact plugs CP are a columnar conductor film, and is made of, for example, a barrier conductor film which covers the lateral walls and bottom surfaces in the contact holes, and a main conductor film which is formed in the contact holes via the barrier conductor film so as to completely bury the contact holes. The barrier conductor film contains, for example, Ti (titanium) or TiN (titanium nitride), and the main conductor film is made of, for example, W (tungsten). FIG. 1 does not show the distinction between the barrier conductor film and the main conductor film configuring the contact plug CP. As shown in FIG. 1, all of the contact plugs CP are connected to the source/drain regions of each MOSFET via the silicide layer S1. In a not-shown region, note that other contact plugs are connected also to the respective upper surfaces of the gate electrodes G1 and G2 via the silicide layer S1.

An interlayer insulating film IL made of, for example, SiOC is formed on the interlayer insulating film CL and the contact plugs CP. In the interlayer insulating film IL, a plurality of wiring trenches which expose the respective upper surfaces of the plurality of contact plugs CP are formed, and a wiring M1 is formed in each of the wiring trenches. The wiring M1 is made of, for example, a barrier conductor film which covers the lateral walls and bottom surfaces in the wiring trenches, and a main conductor film which is formed in the wiring trenches via the barrier conductor film so as to completely bury the wiring trenches.

The barrier conductor film contains, for example, Ta (tantalum) and TaN (tantalum nitride), and the main conductor film is made of, for example, Cu (copper). The wiring M1 is connected to the contact plug Cp. FIG. 1 does not show the barrier conductor film and the main conductor film configuring the wiring M1 so that they are distinguished from each other. The upper surfaces of the wiring M1 and the upper surface of the interlayer insulating film IL are planarized at the same height as each other.

Here, as main characteristics of the semiconductor device of the present embodiment, both of the gate electrodes G1 and G2 of the NMOS Q1 and the PMOS Q2 are made of the P-type semiconductor film, the gate insulating film GF of each of the NMOS Q1 and the PMOS Q2 includes the high-permittivity film HK, and the SOI layer SL configuring the channel region of each of the NMOS Q1 and the PMOS Q2 is the intrinsic semiconductor layer.

Figure 16:
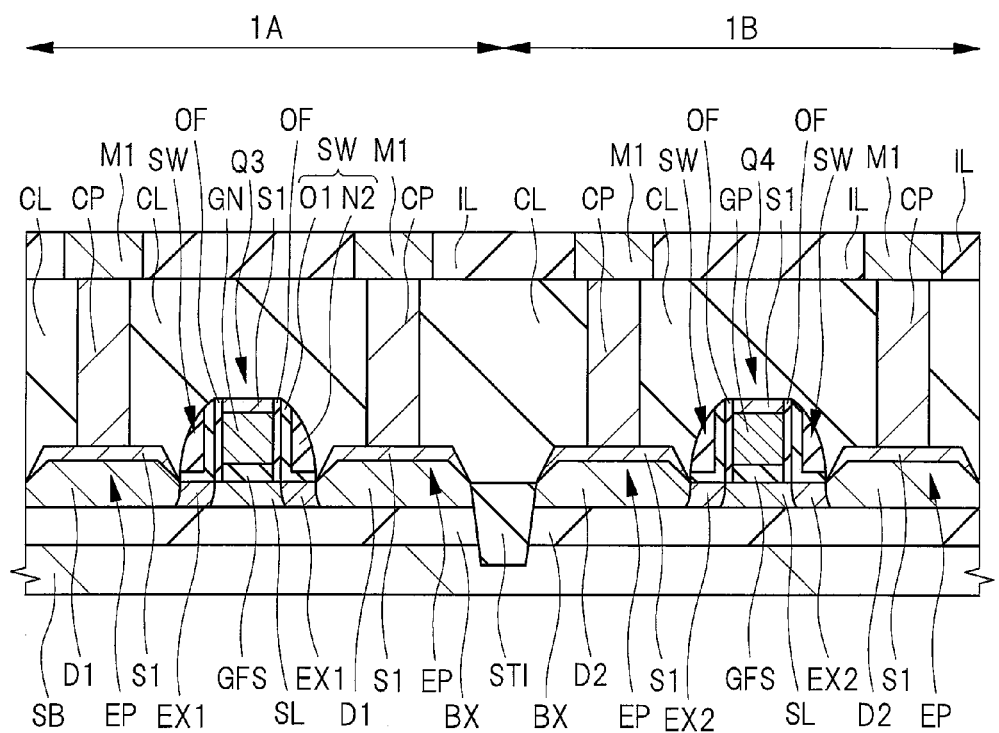
FIG. 16 is a cross-sectional view showing a semiconductor device according to a comparative example.

Hereinafter, effects of the semiconductor device of the present embodiment will be explained in comparison with a semiconductor device of a comparative example shown in FIG. 16. FIG. 16 is a cross-sectional view of a CMOS, which is the semiconductor device shown as the comparative example.

As shown in FIG. 16, the CMOS which is the semiconductor device of the comparative example has a structure similar to that of the semiconductor device of the present embodiment shown in FIG. 1. That is, the CMOS is made of an NMOS Q3 which is formed in an NMOS region 1A on a SOI substrate, and a PMOS Q4 which is formed in a PMOS region 1B. However, the semiconductor device of the comparative example is different from the semiconductor device of the present embodiment in that a gate electrode GN of the NMOS Q3 is made of an N-type semiconductor film containing an N-type impurity (for example, P (phosphorous) or As (arsenic)) and in that a gate insulating film GFS of each of the NMOS Q3 and the PMOS Q4 does not include the high-permittivity film HK.

That is, the gate electrode GN of the NMOS Q3 of the comparative example is made of an N-type polysilicon film having the same conduction type as those of the source/drain regions of the NMOS Q3. Moreover, the gate insulating film GFS is made of a silicon oxynitride (SiON) film. Note that a gate electrode GP of the PMOS Q4 of the comparative example is made of a P-type polysilicon film. Here, the reason why the gate electrode GN of the NMOS Q3 has the same conduction type as those of the source/drain regions of the NMOS Q3 herein is that the N-type impurity is introduced also into the gate electrode GN when ion is implanted in a step of forming the source/drain regions during the manufacture of the NMOS Q3.

Here, if miniaturization of MOSFETs is advanced in a case in which the MOSFETs are formed on a silicon substrate not including a BOX film, that is, on a bulk silicon substrate, short-channel characteristics are deteriorated, which results in a problem of occurrence of punchthrough phenomena. In this case, a depleted layer between a source region and a drain region is connected, so that the part between the source region and the drain region becomes a conducted state, and therefore, the NMOS does not function as a switching element. On the other hand, in the semiconductor device of the above-described comparative example, the miniaturization of MOSFETs can be achieved, and the punchthrough phenome can be prevented so as to improve the short-channel characteristics by forming the MOSFETs on the SOI substrate.

However, the NMOS Q3 configuring the CMOS formed on the SOI substrate of the comparative example has a problem that a leak current between the source region and the drain region, that is, off-leak current tends to flow in an off state of the MOSFET. Regarding this, it is conceivable to increase the work function of the gate electrode by configuring the gate electrode of the NMOS by a P-type semiconductor film. Since the threshold voltage of the NMOS is increased by this, it is conceivable to prevent occurrence of the off-leak current. This is because the increase in the work function of the gate electrode in the NMOS increases the threshold voltage of the NMOS, which result in difficulty of electric current flow between the source region and the drain region of the NMOS in the off state.

However, in a case in which the gate electrode of the NMOS is made of a P-type semiconductor film as described above, the threshold voltage of the NMOS is increased by about 1 V higher than that in the case in which the gate electrode of the NMOS is made of an N-type semiconductor film. The excessive increase in the threshold voltage as described above requires a high power-supply voltage in order to drive the NMOS, and therefore, the power consumption of the semiconductor device is increased. In order to solve this problem, it is also conceivable to adjust the threshold voltage to an appropriate value by introducing an N-type impurity into the channel region of the NMOS. However, introduction of the impurity into the channel region in this manner increases variation in element performance among a plurality of elements. Therefore, a problem that the MOSFET does not normally operates occurs.

In the CMOS, in order to prevent occurrence of the off-leak current between the source region and the drain region, it is required to obtain a high threshold voltage for not only the NMOS but also the PMOS.

Accordingly, in the semiconductor device of the present embodiment, as shown in FIG. 1, the gate electrode G1 of the NMOS Q1 on the SOI substrate is made of the P-type semiconductor film, the high-permittivity film HK is provided as part of the gate insulating film GF, and the channel region is made of an intrinsic semiconductor. Therefore, since the gate electrode G1 of the NMOS Q1 on the SOI substrate is made of the P-type semiconductor film, the work function of the gate electrode G1 is increased, and the work functions of the gate electrodes G1 and G2 become the same as each other. The increase in the work function of the gate electrode G1 as described above increases the threshold voltage of the NMOS Q1, and therefore, occurrence of the off-leak current can be prevented.

Moreover, the high-permittivity film HK is provided in the gate insulating film GF of each of the NMOS Q1 and the PMOS Q2. In this manner, the work function of each of the gate electrode G1 of the NMOS Q1 and the gate electrode G2 of the PMOS Q2 each of which is a P-type gate electrode is reduced. The threshold voltage of the NMOS has such characteristics that the threshold voltage is reduced by the reduction of the work function of the gate electrode of the NMOS, and the threshold voltage of the PMOS has such characteristics that the threshold voltage is increased by the reduction of the work function of the gate electrode of the PMOS. Therefore, by providing the high-permittivity film HK in each of the MOSFETs, the threshold voltage of the NMOS Q1 can be reduced, and the threshold voltage of the PMOS Q2 can be increased.

Specifically, by providing the high-permittivity film HK, the work function of each of the P-type gate electrodes G1 and G2 is reduced by about 0.3 V. In the PMOS Q4 which has the P-type gate electrode and is not provided with the high-permittivity film as described in the above-described comparative example, the threshold voltage is about 0.2 V, and therefore, it is difficult to prevent occurrence of the off-leak current. However, by providing the high-permittivity film HK as similar to the semiconductor device of the present embodiment shown in FIG. 1, the threshold voltage of the PMOS Q2 can be increased up to about 0.5 V without introducing an impurity into the channel region. Thus, appropriate threshold voltages can be obtained for the NMOS Q1 and the PMOS Q2.

Thus, in the PMOS Q2, the threshold voltage of the PMOS Q2 is increased by forming the high-permittivity film HK, so that the occurrence of the off-leak current can be prevented. Moreover, in the NMOS Q1, the threshold voltage of the NMOS Q1 can be reduced down to an appropriate value by forming the high-permittivity film HK. Therefore, increase in the power consumption of the semiconductor device due to excessive increase in the threshold voltage of the NMOS Q1 can be prevented.

That is, by forming the gate electrode G1 of the NMOS Q1 by the P-type semiconductor film, the work function of the gate electrode G1 is increased, and, as a result, there is a risk of the excessive increase in the threshold voltage of the NMOS. However, by providing the high-permittivity film. HK as described above, the threshold voltage of the NMOS Q1 can be appropriately reduced. Therefore, it is not required to introduce, for example, a P-type impurity (for example, B (boron)) into the channel region of the NMOS Q1 on the SOI substrate in order to suppress the increase in the threshold voltage of the NMOS Q1 due to the excessive increase in the work function of the NMOS Q1. Therefore, the performance variation among a plurality of elements due to introduction of an impurity into the SOI layer SL where the channel region of the NMOS Q1 is formed can be prevented. Moreover, since the CMOS is provided on the SOI substrate in this case, the short-channel characteristics can be suppressed without introducing an impurity into the channel region.

Here, the present inventor has found out that the work function of the P-type gate electrode G2 is increased if a compound of Hf (hafnium) and Al (aluminum) is used for the material of the high-permittivity film HK which is formed as a part of the gate insulating film GF of the PMOS Q2. When the work function of the gate electrode G2 is increased, the threshold voltage of the PMOS Q2 is reduced. Therefore, the usage of the compound of Hf (hafnium) and Al (aluminum) for the material of the high-permittivity film HK of the PMOS Q2 is not preferred from the viewpoint of the increase in the threshold voltage of the PMOS Q2.

Moreover, from the viewpoint of the increase in the work function of the gate electrode G1 and the reduction in the work function of the gate electrode G2, the concentration of the Hf (hafnium) configuring the high-permittivity film HK below the gate electrodes is preferred to be high. The present inventor has found out through experiments that a work function of a gate electrode made of a P-type semiconductor film can be reduced if the concentration of Hf (hafnium) per unit area of the surface of the high-permittivity HK is $1 \times 10^{13}$ or larger.

Next, a method of manufacturing the semiconductor device of the present embodiment will be explained by using FIG. 2 to FIG. 15. FIG. 2 to FIG. 15 are cross-sectional views each showing the method of manufacturing the semiconductor device of the present embodiment, and show the cross-sectional surface at the same position as that of FIG. 1. FIG. 2 to FIG. 15 show the NMOS region (first region) 1A on the left side of the drawings and show the PMOS region (second region) 1B on the right side of the drawings. The NMOS region 1A and the PMOS region 1B are two regions which are arranged along the principal surface of the SOI substrate. The NMOS region 1A is a region in which an N-channel-type MOSFET is formed, and the PMOS region 1B is a region in which a P-channel-type MOSFET is formed.

Figure 2:
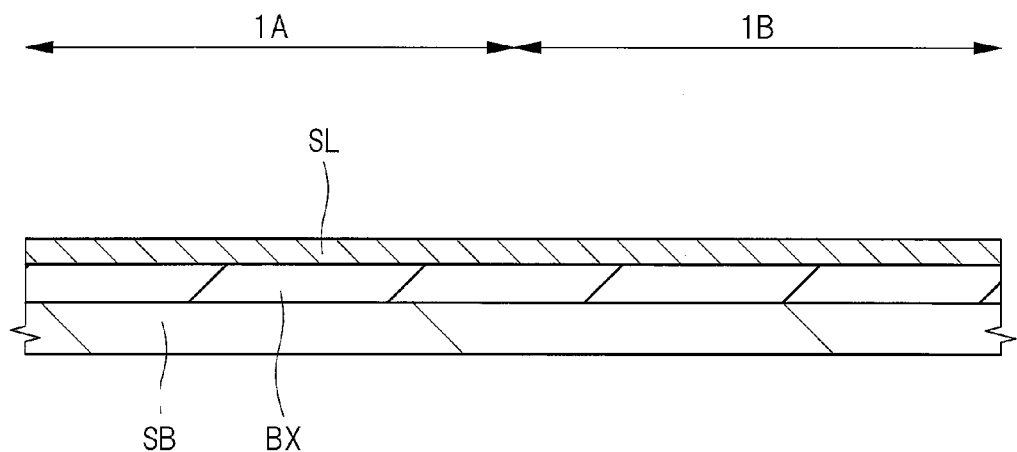
FIG. 2 is a cross-sectional view showing a method of manufacturing the semiconductor device according to the embodiment of the present invention.

First, as shown in FIG. 2, the semiconductor substrate SB above which the BOX film BX and the SOI layer SL are sequentially stacked is prepared. The semiconductor substrate SB is a supporting substrate made of Si (silicon), the BOX film BX on the semiconductor substrate SB is a silicon oxide film, and the SOI layer SL on the BOX film BX is a layer made of single-crystal silicon. The film thickness of the BOX film BX is 5 to 100 nm. Here, the film thickness of the BOX film BX is, for example, 50 nm. The SOI layer SL is an intrinsic semiconductor layer into which a P-type or N-type impurity is hardly introduced. Even if a P-type impurity is introduced into the SOI layer SL, the impurity concentration thereof is $1 \times 10^{17}/cm^3$ or smaller. The film thickness of the SOI layer SL is 3 to 15 nm. Here, the film thickness of the SOI layer SL is 15 nm.

The SOI substrate made of the semiconductor substrate SB, the BOX film BX, and the SOI layer SL can be formed by a SIMOX (Silicon Implanted Oxide) method. That is, the SOI substrate can be formed by ion-implanting $O_2$ (oxygen) into the principal surface of the semiconductor substrate SB made of Si (silicon) with high energy, coupling Si (silicon) and oxygen in a subsequent thermal treatment, and forming a buried oxide film (BOX film) at a position slightly deeper than the surface of the semiconductor substrate. The SOI substrate can be also formed by bonding and attaching the semiconductor substrate SB having an oxide film formed on its surface and another semiconductor substrate made of Si (silicon) with each other by applying heat and a pressure thereto, and then, thinning a silicon layer on one side by polishing.

Figure 3:
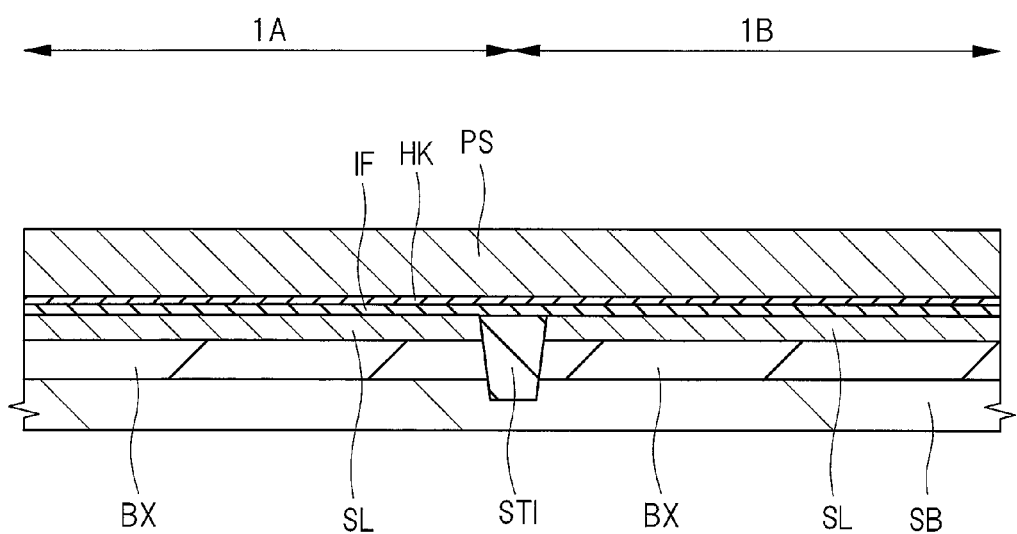
FIG. 3 is a cross-sectional view showing the method of manufacturing the semiconductor device continued from FIG. 2.

Next, as shown in FIG. 3, the element isolation region STI is formed by using a publicly-known method. The element isolation region STI is made of an insulating film buried in a trench which opens the upper surface of the SOI substrate and which reaches the upper surface of the BOX film BX or an intermediate depth of the semiconductor substrate SB. The element isolation region STI has, for example, a STI structure, and is mainly made of a silicon oxide ($SiO_2$) film. The element isolation region STI is formed on the upper surface of the SOI substrate at the boundary between the NMOS region 1A and the PMOS region 13.

Subsequently, a P well (not shown) is formed from the upper surface of the semiconductor substrate SB to a comparatively deep region of the semiconductor substrate SB by using a photolithography technique so that a P-type impurity (for example, B (boron)) is implanted into the semiconductor substrate SB in the NMOS region 1A at a comparatively low concentration by an ion implantation method. Here, the P well is not formed in the semiconductor substrate SB in the PMOS region 1B. Subsequently, an N well (not shown) is formed by using the photolithography technique so that an N-type impurity (for example, P (phosphorous) or As (arsenic)) is implanted into the semiconductor substrate SB in the PMOS region 1B. In the above-described steps of forming the P well and the N well, the ion implantation is performed so that the impurities are not introduced into the SOI layer SL as much as possible.

Subsequently, the insulating film IF made of a silicon oxynitride (SiON) film is formed on the SOI layer SL by using a CVD (Chemical Vapor Deposition) method or others. Then, the high-permittivity film HK and a polysilicon film PS are sequentially formed on the insulating film IF by using the CVD method or others. The high-permittivity film HK is an insulating film having a higher permittivity than those of a silicon oxide ($SiO_2$) film and a silicon oxynitride film, and is, for example, a high-k film containing a high-permittivity material such as $HfO_2$, HfON, or HFSiON. The concentration of Hf (hafnium) per unit area of the surface of the high-permittivity film HK is, for example, $1×10^{13}$ to $5×10^{14}/cm^2$. However, the material configuring the high-permittivity film HK is not a Hf (hafnium) or Al (aluminum) compound. This is for reducing the work function of the PMOS gate electrode as described above.

The film thickness of the polysilicon film PS is 150 nm or smaller. Here, the film thickness of the polysilicon film PS is, for example, 100 nm. The polysilicon film PS may already have a crystalline substance at the point of film formation, or the polysilicon film PS may be formed by crystallizing a film which is an amorphous silicon film at the point of film formation by thermal treatment after film formation (after ion implantation).

Figure 4:
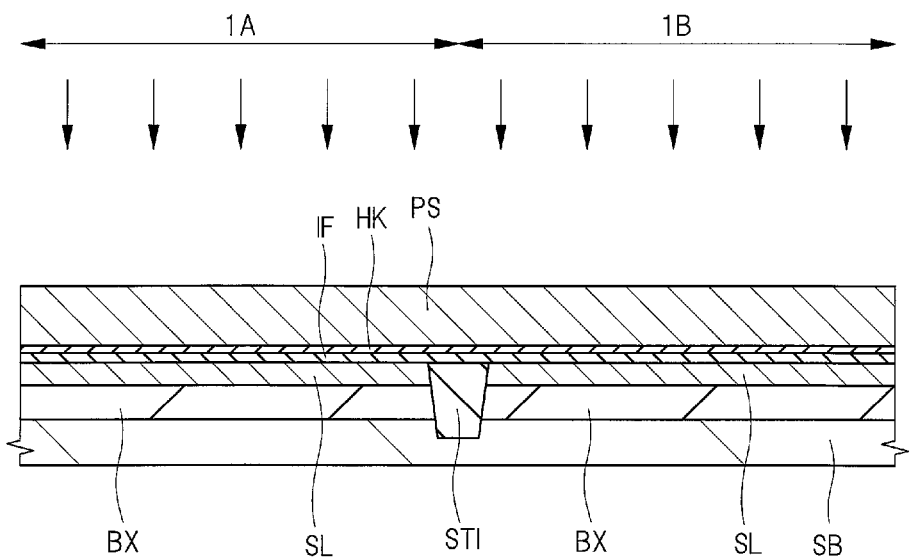
FIG. 4 is a cross-sectional view showing the method of manufacturing the semiconductor device continued from FIG. 3.

Next, as shown in FIG. 4, for example, by using the ion implantation method, a P-type impurity (for example, B (boron)) is implanted into the polysilicon film PS in both of the NMOS region 1A and the PMOS region 1B at a comparatively high concentration. In this manner, the polysilicon film PS is formed into a P-type semiconductor film. Instead of the above-described ion implantation step, a P-type impurity (for example, B (boron)) may be introduced into the polysilicon film PS upon film formation of the polysilicon film PS in the film formation step explained by using FIG. 3.

Figure 5:
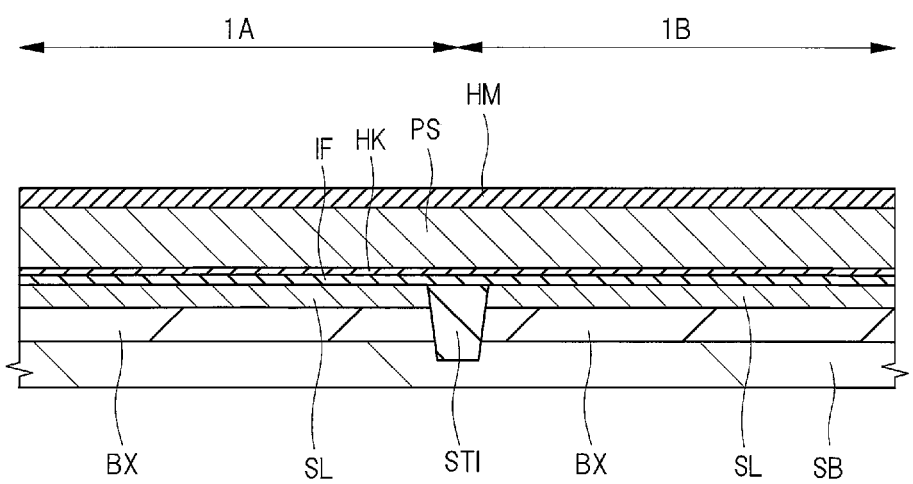
FIG. 5 is a cross-sectional view showing the method of manufacturing the semiconductor device continued from FIG. 4.

Next, as shown in FIG. 5, an insulating film HM is formed on the polysilicon film PS by, for example, using the CVD method. The insulating film HM is made of, for example, a silicon nitride ($Si_3N_4$) film. The film thickness of the insulating film HM is, for example, 40 nm.

Figure 6:
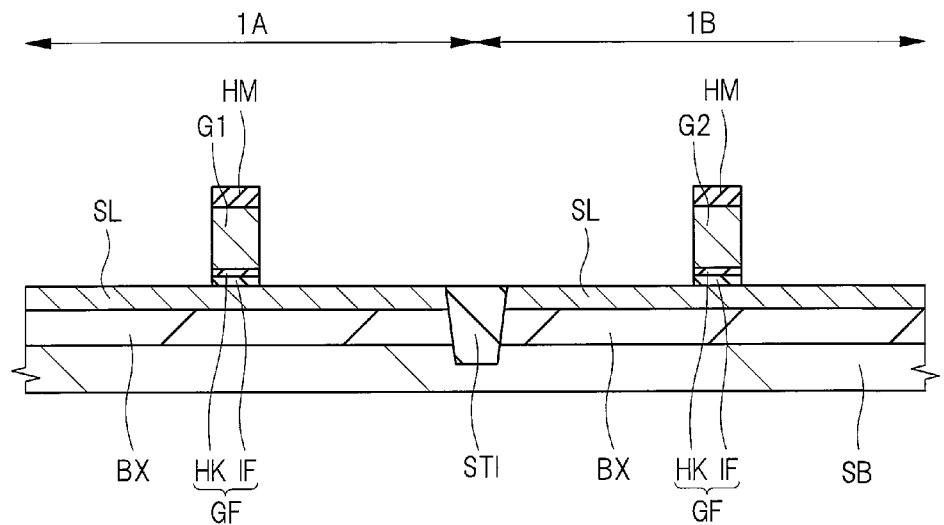
FIG. 6 is a cross-sectional view showing the method of manufacturing the semiconductor device continued from FIG. 5.

Next, as shown in FIG. 6, the insulating film HM is patterned by using a photolithography technique and a dry etching method. Subsequently, the polysilicon film PS, the high-permittivity film HK, and the insulating film IF are patterned by the dry etching method while using the insulating film HM as a hard mask. In this manner, the gate insulating film GF made of the high-permittivity film HK and the insulating film IF is formed on the SOI layer SL in the NMOS region 1A, and the gate electrode G1 made of the polysilicon film PS is formed on the gate insulating film GF. Moreover, by the above-described patterning step using the insulating film HM as the hard mask, the gate insulating film GF made of the high-permittivity film HK and the insulating film IF is formed on the SOI layer SL in the PMOS region 1B, and the gate electrode G2 made of the polysilicon film PS is formed on the gate insulating film GF.

Figure 7:
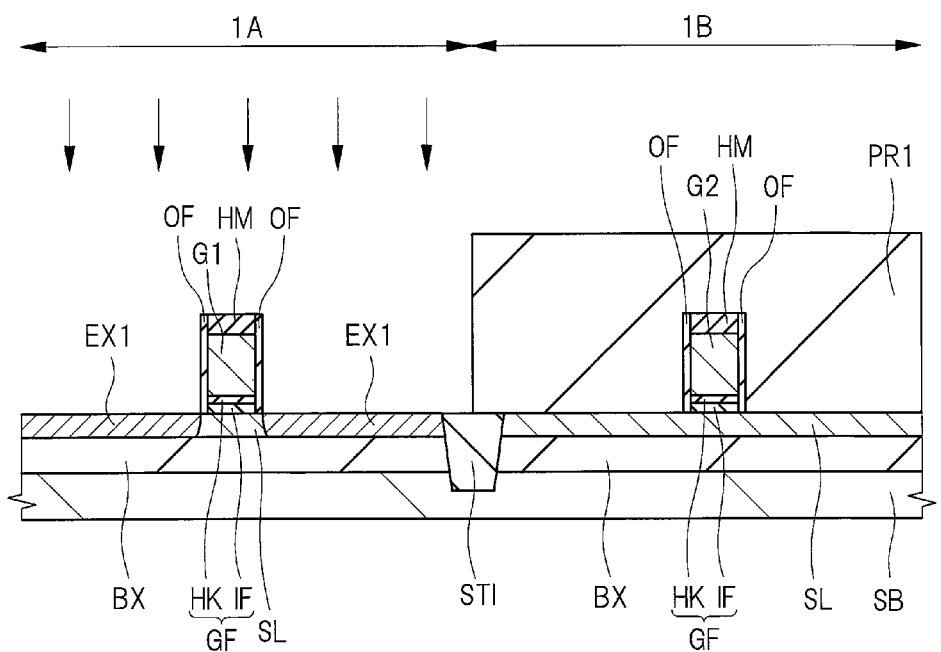
FIG. 7 is a cross-sectional view showing the method of manufacturing the semiconductor device continued from FIG. 6.

Next, as shown in FIG. 7, the offset spacer OF is made of a thin insulating film covering the lateral walls of the gate electrodes G1 and G2 are formed. The offset spacer OF is made of, for example, a silicon nitride ($Si_3N_4$) film. Here, the offset spacer OF made of the silicon nitride film which is in contact with the lateral walls on both sides of each of the gate electrodes G1 and G2 is formed by, for example, depositing a silicon nitride film on the SOI substrate by using the CVD method, and then, partially removing the silicon nitride film by using the dry etching method, and exposing the upper surface of the SOI layer SL.

Subsequently, by using the photolithography technique so that the NMOS region 1A is exposed, a photoresist film PR1 covering the PMOS region 1B is formed. That is, the photoresist film PR1 covers the upper surface of the SOI layer SL of the PMOS region 1B.

Then, while the photoresist film PR1, the offset spacers OF of the NMOS region 1A, and the insulating film HM are used as a mask, an N-type impurity (for example, P (phosphorous) or As (arsenic)) is implanted into the SOI layer SL at a comparatively low concentration by using the ion implantation method. In this manner, the extension regions EX1 are formed in the upper surface of the SOI layer SL which is exposed next to the gate electrode G1 and the gate insulating film GF. The extension regions EX1 are not formed partially in the upper surface of the SOI layer SL formed immediately below the gate electrode G1. The extension regions EX1 may reach or may not reach the lower surface of the SOI layer SL.

Figure 8:
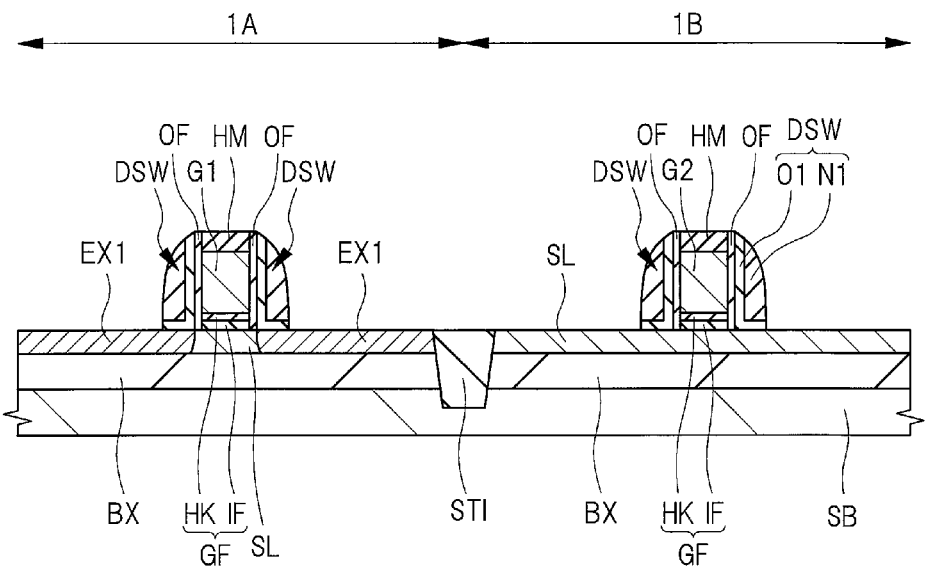
FIG. 8 is a cross-sectional view showing the method of manufacturing the semiconductor device continued from FIG. 7.

Next, as shown in FIG. 8, a stacking layer film is formed by removing the photoresist film PR1, and then, sequentially depositing the silicon oxide film O1 and a silicon nitride film N1 by using, for example, the CVD method so as to cover the upper surface of the SOI layer SL, the insulating film HM, the offset spacers OF, and the gate electrodes G1 and G2. Then, the stacking layer film made of the silicon oxide film O1 and the silicon nitride film N1 is partially removed by anisotropic etching by an RIE (Reactive Ion Etching) method or others, so that the upper surface of the SOI layer SL and the upper surface of the insulating film HM are exposed. In this manner, sidewalls DSW made of the silicon oxide film O1 and the silicon nitride film N1 are formed in self alignment on the respective lateral walls of the gate electrodes G1 and G2 via the offset spacers OF.

Here, the silicon nitride film Ni is an insulating film configuring dummy sidewalls used for forming an epitaxial layer, that is, a selective growth layer at a position distant from the gate electrodes in a later step. The silicon oxide film O1 has a role as an etching stopper film when the silicon nitride film N1 is removed in a later step. Note that the film thickness of the silicon oxide film O1 is 5 nm, and the film thickness of the silicon nitride film N1 is 40 nm.

Figure 9:
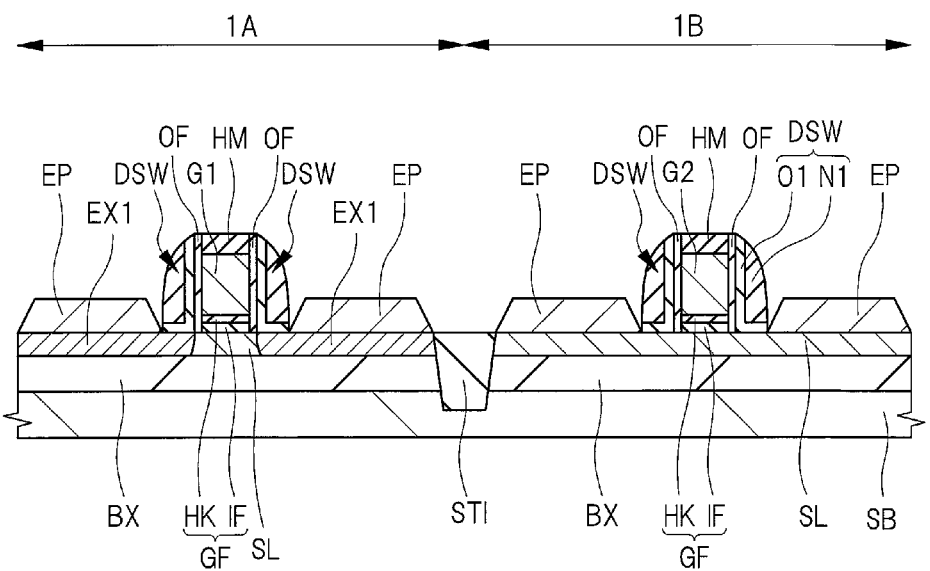
FIG. 9 is a cross-sectional view showing the method of manufacturing the semiconductor device continued from FIG. 8.

Next, as shown in FIG. 9, the epitaxial layer EP mainly made of Si (silicon) is formed on the upper surface of the SOI layer SL, which is exposed from the gate insulating film GF, the offset spacers OF, and the sidewalls DSW, by using the epitaxial growth method. In this manner, in the regions next to each of the gate electrodes G1 and G2, the epitaxial layers EP, which are silicon layers having an upper surface higher than that of the SOI layer SL, are formed. The epitaxial layers EP are semiconductor layers not containing an impurity.

In this step, in the NMOS region 1A, the pair of epitaxial layers EP is formed on the SOI layer SL to have a film thickness of 20 to 40 nm at the positions distant from the lateral walls on both sides of the gate electrode G1 so as to sandwich the gate electrode G1. Also, in the PMOS region 1B, the pair of epitaxial layers EP is formed on the SOI layer SL to have a film thickness of 20 to 40 nm at the positions distant from the lateral walls on both sides of the gate electrode G2 so as to sandwich the gate electrode G2.

Note that the formation of the epitaxial layers EP next to the gate electrode G1 results from the extremely thin film thickness of the SOI layer SL. That is, one reason why the epitaxial layers EP are formed is that it is required to supplement the film thickness of the SOI layer SL configuring the source/drain regions when the silicide layer is formed. In the epitaxial growth step, the insulating film HM has a role to prevent the formation of the epitaxial layer on each of the upper parts of the gate electrodes G1 and G2.

Figure 10:
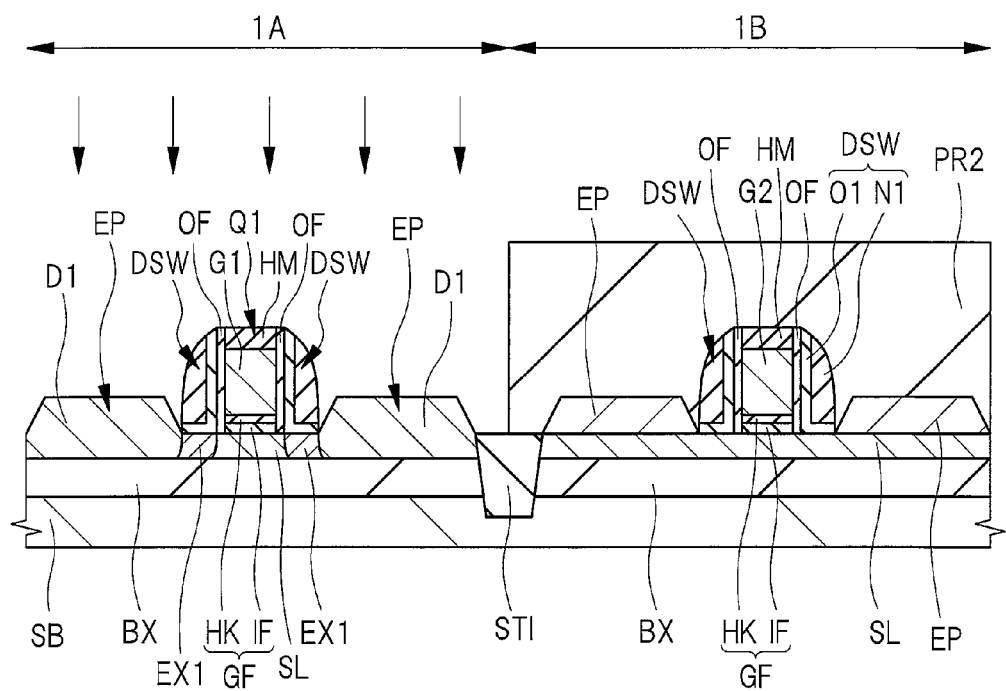
FIG. 10 is a cross-sectional view showing the method of manufacturing the semiconductor device continued from FIG. 9.

Next, as shown in FIG. 10, by using the photolithography technique so that the NMOS region 1A is exposed, a photoresist film PR2 covering the PMOS region 1B is formed. That is, the photoresist film PR2 covers the epitaxial layers EP of the PMOS region 1B.

Then, while the photoresist film PR2, the offset spacers OF of the NMOS region 1A, the insulating film HM, and the sidewalls DSW are used as a mask, an N-type impurity (for example, P (phosphorous) or As (arsenic)) is implanted from above the SOI layer SL into the SOI layer SL at a comparatively high concentration by using the ion implantation method. In this manner, the diffusion regions D1 are formed in the epitaxial layer EP exposed next to the gate electrode G1 and in the SOI layer SL immediately below the epitaxial layer EP. Note that the diffusion regions D1 are formed in only the epitaxial layer EP, and may not be formed in the SOI layer SL immediately below the epitaxial layer EP.

The extension regions EX1 and the diffusion regions D1 are semiconductor regions configuring the source/drain regions. The source/drain regions have the LDD structure in which the extension region EX1 containing a low-concentration impurity is provided between the diffusion region D1 into which the impurity is introduced at a high concentration and the SOI layer SL which serves as the channel region immediately below the gate electrode G1. In other words, the impurity concentration of the diffusion region D1 is higher than the impurity concentration of the extension region EX1. At this time, since the upper surface of the gate electrode G1 is covered by the insulating film HM, the N-type impurity is not introduced into the gate electrode G1 in the above-described ion implantation step. Therefore, the gate electrode G1 remains to be the P-type semiconductor film.

As described above, the NMOS Q1, which is an N-channel-type MOSFET including the source/drain regions made of the gate electrode G1, the extension regions EX1 and the diffusion regions D1, is formed in the NMOS region 1A.

Figure 11:
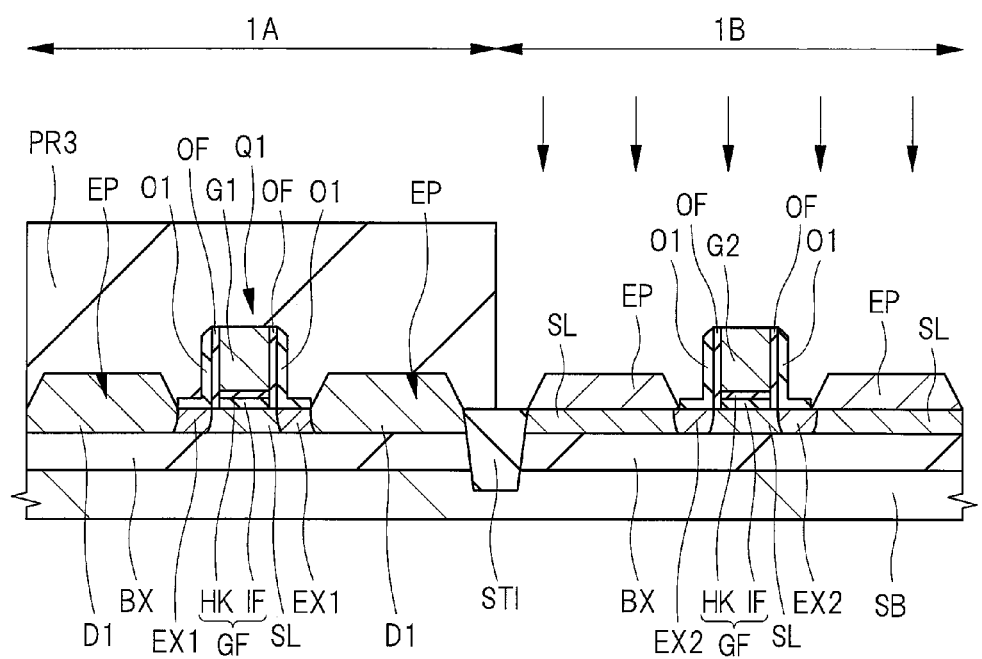
FIG. 11 is a cross-sectional view showing the method of manufacturing the semiconductor device continued from FIG. 10.

Next, after the photoresist film PR2 is removed as shown in FIG. 11, the silicon nitride film exposed in the NMOS region 1A and the PMOS region 1B is removed. That is, the silicon nitride film N1 which configures the sidewalls DSW, the offset spacers OF which are formed so as to be higher than the upper surfaces of the gate electrodes G1 and G2, and the insulating film HM are removed. In this manner, the silicon oxide film O1 is exposed, and the upper surfaces of the gate electrodes G1 and G2 are exposed. Note that a method of manufacturing the extension regions EX1 before the removal of the silicon nitride film Ni is explained here. However, the extension regions EX1 may be formed after the removal of the silicon nitride film N1.

Subsequently, by using the photolithography technique so that the PMOS region 1B is exposed, a photoresist film PR3 covering the NMOS region 1A is formed.

Then, while using the photoresist film PR3, the offset spacers OF of the PMOS region 1B, and the gate electrode G2 as a mask, a P-type impurity (for example, B (boron)) is implanted into the SOI layer SL at a comparatively high concentration by using the ion implantation method. In this manner, the extension regions EX2 are formed on the upper surface of the SOI layer SL next to the gate electrode G2 and the gate insulating film GF. The extension regions EX2 are not formed in the part of the upper surface of the SOI layer SL formed immediately below the gate electrode G2. The extension regions EX2 may reach or may not reach the lower surface of the SOI layer SL.

In this step, the implanted P-type impurity ion penetrates through the silicon oxide film O1 and reaches inside of the SOI layer SL. Here, the impurity is introduced also into the epitaxial layers EP. However, illustration of P-type semiconductor regions which are formed in the epitaxial layers EP by the introduction is omitted.

Figure 12:
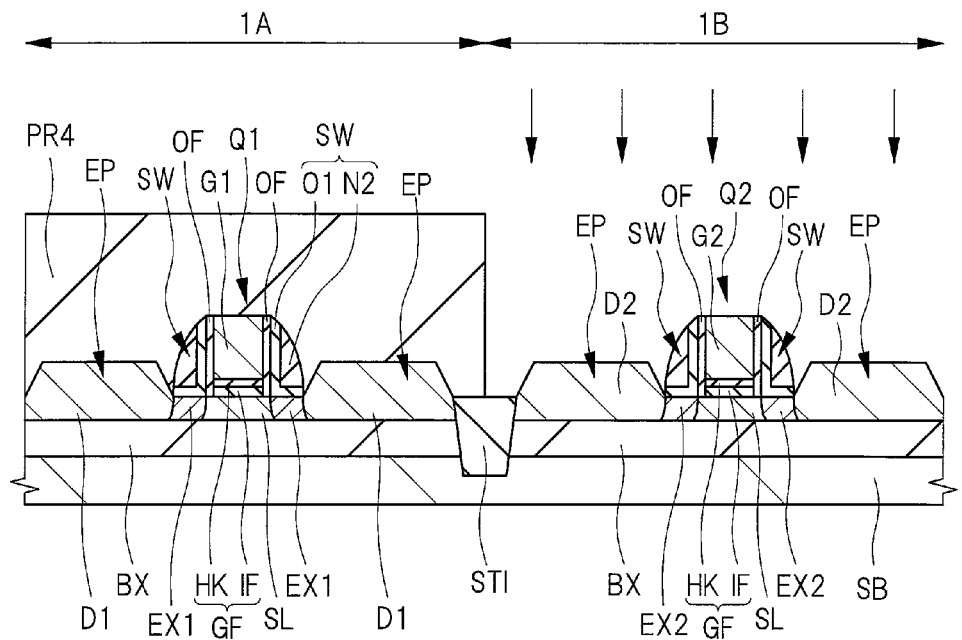
FIG. 12 is a cross-sectional view showing the method of manufacturing the semiconductor device continued from FIG. 11.

Then, as shown in FIG. 12, after the photoresist film PR3 is removed, the silicon nitride film N2 is formed by using, for example, the CVD method so as to cover each of the gate electrodes G1 and G2, the silicon oxide film O1, and the epitaxial layers EP. Then, the silicon nitride film N2 is partially removed by anisotropic etching by the RIE method or others, so that the upper surface of each of the gate electrodes G1 and G2 and the epitaxial layers EP is exposed. In this manner, the silicon nitride film N2 is formed in self alignment on the lateral walls on both sides of the gate electrode G1 and the lateral walls on both sides of the gate electrode G2 via the offset spacers OF and the silicon oxide film O1. Therefore, the sidewalls SW made of the silicon oxide film O1 and the silicon nitride film N2 are formed so as to be in contact with the lateral walls of the offset spacers OF.

Subsequently, by using a photolithography technique so that the PMOS region 1B is exposed, the photoresist film PR4 covering the NMOS region 1A is formed.

Then, while the photoresist film PR4, the offset spacers OF of the PMOS region 1B, the gate electrode G2, and the sidewalls SW are used as a mask, a P-type impurity (for example, B (boron)) is implanted from above the SOI layer SL into the SOI layer SL at a comparatively high concentration by using the ion implantation method. In this manner, the diffusion regions D2 are formed in the epitaxial layer EP exposed next to the gate electrode G2 and in the SOI layer SL formed immediately below the epitaxial layer EP. Note that the diffusion regions D2 may be formed in only the epitaxial layer EP, and may not be formed in the SOI layer SL formed immediately below the epitaxial layer EP.

The formation step of the diffusion regions D2 may be performed after the step of removing the insulating film HM (see FIG. 11), and besides, after the step of forming the silicon nitride film N2, that is, the step of reattaching the sidewalls SW (see FIG. 12) as described above. On the other hand, the step of forming the diffusion regions D2 may be performed after the step of forming the epitaxial layers EP (see FIG. 9), and besides, before the step of removing the insulating film HM serving as a hard mask (see FIG. 11). This is because, in the ion implantation step of forming the source/drain regions of the PMOS, there is no problem even if the P-type impurity is introduced into the gate electrode G2, which is not covered by the hard mask.

The extension regions EX2 and the diffusion regions D2 are semiconductor regions configuring the source/drain regions. The source/drain regions have the LDD structure in which the extension region EX2 containing a low-concentration impurity is provided between the diffusion region D2 into which the impurity is introduced at a high concentration and the SOI layer SL which serves as the channel region formed immediately below the gate electrode G2. That is, the impurity concentration of the diffusion region D2 is higher than the impurity concentration of the extension region EX2. At this time, since the upper surface of the gate electrode G2 is exposed, the P-type impurity is introduced into the gate electrode G2 in the above-described ion implantation step. Therefore, the gate electrode G2 remains to be the P-type semiconductor film.

As described above, the PMOS Q2, which is a P-channel-type MOSFET including the source/drain regions made of the gate electrode G2, the extension regions EX2 and the diffusion regions D2, is formed in the PMOS region 1B.

Figure 13:
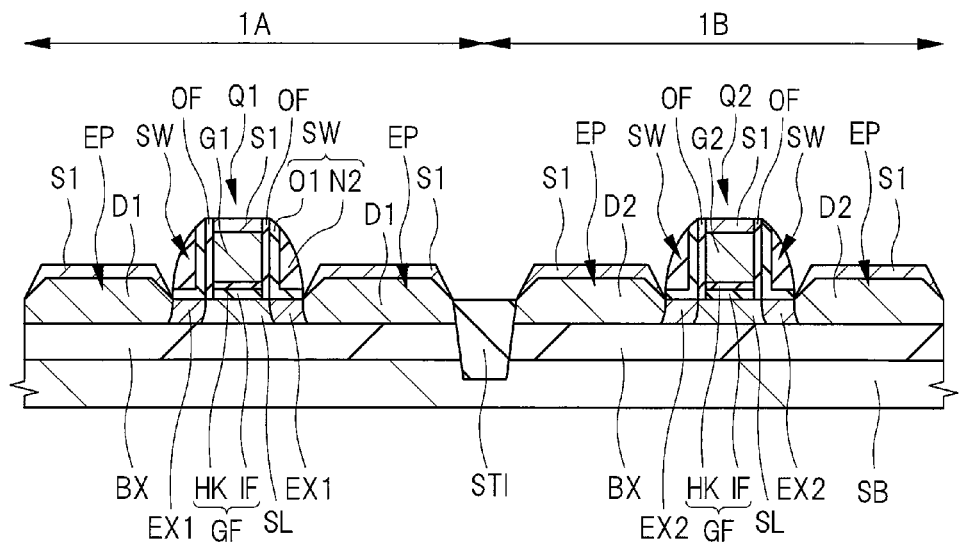
FIG. 13 is a cross-sectional view showing the method of manufacturing the semiconductor device continued from FIG. 12.

Then, as shown in FIG. 13, after the photoresist film PR4 is removed, the silicide layer S1 is formed on the gate electrodes G1 and G2 and the epitaxial layers EP by using a publicly-known salicide technique. The silicide layer S1 is made of, for example, CoSi (cobalt silicide).

Figure 14:
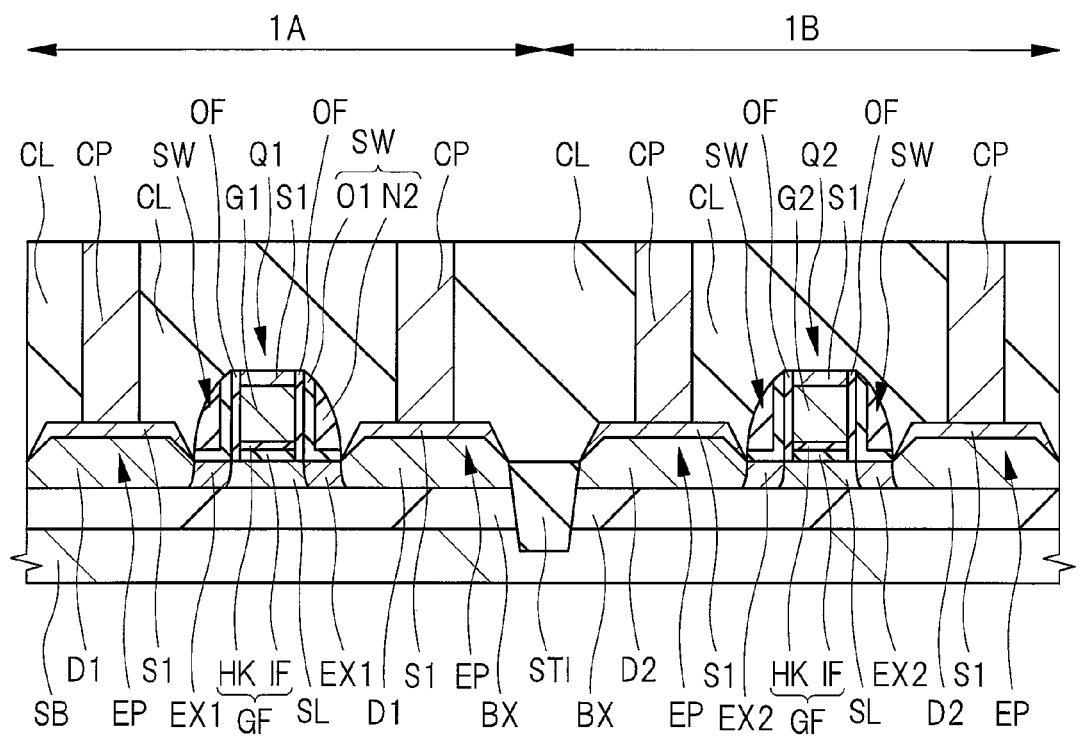
FIG. 14 is a cross-sectional view showing the method of manufacturing the semiconductor device continued from FIG. 13.

Next, as shown in FIG. 14, the interlayer insulating film CL is formed on the gate electrodes G1 and G2 and the epitaxial layers EP by using, for example, the CVD method or others. The interlayer insulating film CL is made of, for example, a silicon oxide film. Then, the upper surface of the interlayer insulating film CL is planarized by polishing by, for example, a CMP (Chemical Mechanical Polishing) method or others. In this manner, each of the NMOS Q1 and the PMOS Q2 is covered by the interlayer insulating film CL.

Subsequently, the interlayer insulating film CL is opened by using the photolithography technique and the dry etching method, so that the plurality of contact holes which expose the upper surface of the silicide layer S1 are formed. Then, the contact holes are completely buried by sequentially forming the barrier conductor film which contains, for example, Ti (titanium) or TiN (titanium nitride) and the main conductor film which is made of, for example, W (tungsten) by using, for example, a sputtering method. Subsequently, by exposing the upper surface of the interlayer insulating film CL by polishing the barrier conductor film and the main conductor film by, for example, the CMP method, the contact plugs CP made of the barrier conductor film and the main conductor film buried inside each of the plurality of contact holes.

The contact plugs CP are connected via the silicide layer S1 to the diffusion regions D1 which configure the pair of source/drain regions of the NMOS Q1, and the contact plugs CP are connected via the silicide layer S1 to the diffusion regions D2 which configure the pair of source/drain regions of the PMOS Q2. In an unshown region, other contact plugs are connected via the silicide layer S1 also to the upper surface of each of the gate electrodes G1 and G2.

Figure 15:
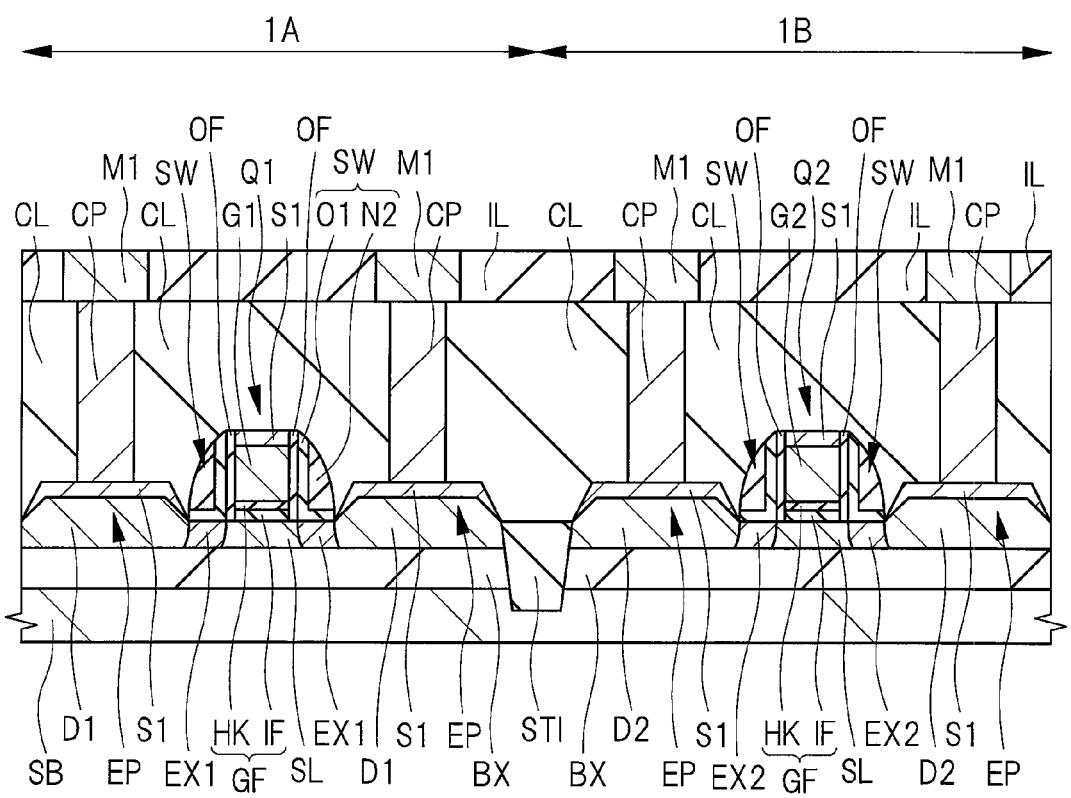
FIG. 15 is a cross-sectional view showing the method of manufacturing the semiconductor device continued from FIG. 14.

Next, as shown in FIG. 15, the interlayer insulating film IL and the wiring M1 are formed on the interlayer insulating film CL. The interlayer insulating film IL is made of, for example, SiOC, and is formed by, for example, the CVD method. When the wiring M1 is formed, first, a plurality of wiring trenches exposing the upper surfaces of the plurality of contact plugs CP are formed by forming openings in the interlayer insulating film IL by forming the opening by using the photolithography technique and the dry etching method. Then, each wiring trench is completely buried by sequentially forming the barrier conductor film containing, for example, Ta (tantalum) or TaN (tantalum nitride), and the main conductor film made of, for example, Cu (copper) by using, for example, the sputtering method.

Then, by exposing the upper surface of the interlayer insulating film IL by polishing the barrier conductor film and the main conductor film by, for example, the CMP method, the wiring M1 made of the barrier conductor film and the main conductor film buried in the plurality of wiring trenches is formed. Through the above-described steps, the semiconductor device having the CMOS including the NMOS Q1 and the PMOS Q2 according to the present embodiment is completed.

As explained by using FIG. 1 and FIG. 16, in the semiconductor device of the present embodiment, excessive increase in the threshold voltage of the NMOS Q1 can be suppressed, and an appropriate threshold voltage can be obtained by providing the high-permittivity film HK in the gate insulating film GF of the NMOS Q1 having the P-type gate electrode G1 without introducing an impurity into the channel region in the SOI layer SL.

Here, in the manufacturing steps of the semiconductor device of the comparative example explained by using FIG. 16, it is conceivable to use the insulating film HM as a hard mask as shown in FIG. 6 in a processing step of forming the gate electrodes GN and GP. However, this hard mask is formed in order to process the gate electrodes G1 and G2 and the gate insulating film GFS and to prevent the formation of the epitaxial layer on the upper part of each of the gate electrodes GN and GP in the step of forming the epitaxial layers EP. Therefore, in the manufacturing steps of the comparative example, the hard mask is removed immediately after the step of forming the epitaxial layers EP, that is, the step corresponding to FIG. 9.

In the comparative example, then, an ion implantation step for forming the diffusion regions D1 configuring the source/drain regions of the NMOS Q3 is performed. In this process, since the upper surface of the gate electrode GN is not covered by the above-described hard mask, an N-type impurity is implanted also into the gate electrode GN in the ion implantation step. Therefore, the gate electrode GN of the comparative example becomes an N-type semiconductor film.

If miniaturization of the MOSFET is advanced, it is conceivable that the height of the gate electrode GN becomes low. Particularly, if the height of the gate electrode GN becomes lower than 200 nm, N-type impurity ion easily reaches the lower part in the gate electrode GN in the above-described ion implantation step for forming the source/drain regions, and therefore, the manufacturing method of the above-described comparative example makes the conduction type of the gate electrode GN difficult to maintain at the P type.

Due to above-described reasons, if the gate electrode GN of the NMOS Q3 is made of an N-type semiconductor film as similar to the comparative example, the threshold voltage of the NMOS Q3 is low, and therefore, there is a problem that an off-leak current easily flows. On the other hand, in the method of manufacturing the semiconductor device of the present embodiment, the step of forming the extension regions EX1 in the NMOS region 1A (see FIG. 7) and the step of forming the diffusion regions D1 (see FIG. 10) are performed in a state that the insulating film HM serving as the hard mask remains even after the step of forming the epitaxial layers EP explained by using FIG. 9. In this manner, the conduction type of the gate electrode G1 covered by the insulating film HM can be maintained at the P type, and therefore, the work function of the gate electrode G1 can be increased. Therefore, since the threshold voltage of the NMOS Q1 is increased, occurrence of the off-leak current can be prevented.

Moreover, since the high-permittivity film HK is provided as a part of the gate insulating film GF, the work function of the P-type gate electrode G1 is lower than that of the case without the formation of the high-permittivity film HK. In this manner, the threshold voltage of the NMOS Q1 is reduced. In this manner, without introducing an N-type impurity into the channel region of the NMOS, excessive increase in the threshold voltage of the NMOS Q1 can be prevented, and the threshold voltage of the NMOS Q1 can be adjusted to an appropriate value. Therefore, while variation in the element performance among the plurality of elements due to the introduction of the N-type impurity into the channel region of the NMOS is prevented, electric power of the NMOS Q1 can be saved by suppressing the threshold voltage of the NMOS Q1. Moreover, here, since the CMOS is provided on the SOI substrate, short-channel characteristics can be suppressed without introducing an impurity into the channel region.

Moreover, also in the PMOS Q2, the work function of the gate electrode G2 is reduced by providing the high-permittivity film HK in the gate insulating film GF. In this manner, since the PMOS Q2 can obtain a higher threshold voltage, occurrence of the off-leak current at the PMOS Q2 can be prevented.

Moreover, in the method of manufacturing the semiconductor device of the present embodiment, the upper surface of the gate electrode G1 is covered by the insulating film HM in the step of forming the extension regions EX1 (see FIG. 7) and the step of forming the diffusion regions D1 (see FIG. 10). Therefore, even if miniaturization of the MOSFET is advanced so that the height of the gate electrode G1 is lower than 200 nm, it is possible to prevent the introduction of the N-type impurity into the gate electrode G1 in the above-described ion implantation step for forming the source/drain regions. Therefore, since the conduction type of the gate electrode G1 can be easily maintained at the P type, the threshold voltage of the NMOS Q1 can be increased, and the semiconductor device can be miniaturized.

In the foregoing, the invention made by the present inventor has been concretely described based on the embodiments. However, it is needless to say that the present invention is not limited to the foregoing embodiments and various modifications and alterations can be made within the scope of the present invention.

What is claimed is:

1. A semiconductor device comprising:
a semiconductor substrate;
a first insulating film on the semiconductor substrate;
a semiconductor layer directly on the first insulating film;
a first gate electrode including a first semiconductor film of a P type, which is formed on the semiconductor layer via a second insulating film; and
a pair of first source/drain regions formed by introducing an impurity of an N type into the semiconductor layer next to the first gate electrode,
wherein the semiconductor substrate, the first insulating film, and the semiconductor layer configure a SOI substrate,
the first gate electrode and the pair of first source/drain regions configure an N-channel-type field-effect transistor,
the second insulating film contains a material having a permittivity higher than a permittivity of silicon oxide and includes hafnium (Hf),
wherein the first semiconductor film is in contact with the second insulating film,
wherein the semiconductor layer mutually between the pair of first source/drain regions, and extending from an upper surface of the semiconductor layer to a lower surface of the semiconductor layer contacting the first insulating film, is an intrinsic semiconductor layer that is undoped,
wherein, among a first region and a second region arranged in a direction along an upper surface of the SOI substrate, the N-channel-type field-effect transistor is formed in the first region, and a P-channel-type field-effect transistor is formed in the second region,
wherein the P-channel-type field-effect transistor has:
a second gate electrode including a second semiconductor film of the P type, which is formed on the semiconductor layer of the second region via a third insulating film; and
a pair of second source/drain regions formed by introducing an impurity of the P type into the semiconductor layer next to the second gate electrode,
the third insulating film contains a material having a permittivity higher than the permittivity of silicon oxide and includes Hf, and
a concentration of Hf per unit area of a surface of each of the second and third insulating films is $1 \times 10^{13}/\text{cm}^2$ or greater.

2. The semiconductor device according to claim 1, wherein the second insulating film comprises:
a first film having the material with the permittivity higher than a permittivity of silicon oxide; and
a second film disposed between the first film and the semiconductor layer.

3. The semiconductor device according to claim 2, wherein the second film is comprised of a material different than the material of the first film.

4. The semiconductor device according to claim 1, further comprising a silicide layer in contact with the first semiconductor film.

5. The semiconductor device according to claim 1, wherein a sidewall is formed over a side surface of the first gate electrode, and an offset spacer is between the side surface of the first gate electrode and the sidewall.

6. The semiconductor device according to claim 1, wherein a sidewall is formed over a side surface of the first gate electrode and comprises a first sidewall film and a second sidewall film,
a first portion of the first sidewall film is disposed between the side surface of the first gate electrode and the second sidewall film, and
a second portion of the first sidewall film is disposed between the second sidewall film and the semiconductor layer.

7. The semiconductor device according to claim 1, wherein the first semiconductor film is in direct contact with the second insulating film.

8. A semiconductor device comprising:
an SOI substrate comprising:
a base substrate;
a semiconductor layer over the base substrate; and
a first insulating film between the base substrate and the semiconductor layer, the semiconductor layer directly contacting the first insulating film;
an n-channel-type field-effect transistor formed on the SOI substrate and comprising:
a second insulating film formed on the semiconductor layer;
a first gate electrode including a p-type semiconductor film that is in contact with the second insulating film; and
an n-type source region and an n-type drain region formed in the semiconductor layer, the first gate electrode being between the n-type source and drain regions in plan view; and
a p-channel-type field-effect transistor on the SOI substrate and comprising:
a third insulating film formed over the semiconductor layer;
a second gate electrode including a p-type semiconductor film that is in contact with the third insulating film; and
a p-type source region and a p-type drain region formed in the semiconductor layer, the second gate electrode being between the p-type source and drain regions in plan view, wherein the second insulating film contains a material having a permittivity higher than that of silicon oxide and includes hafnium (Hf), the n-channel-type field-effect transistor is formed in a region of the SOI substrate separated from a region of the SOI substrate where the p-channel-type field-effect transistor is formed, the third insulating film contains a material having a permittivity higher than that of silicon oxide and includes Hf, a concentration of Hf per unit area of a surface of each of the second and third insulating films is $1 \times 10^{13}/cm^2$ or greater, and the semiconductor layer under the first gate electrode, and extending from an upper surface of the semiconductor layer to a lower surface of the semiconductor layer contacting the first insulating film, is an intrinsic semiconductor that is undoped.

9. The semiconductor device according to claim 8, wherein the second insulating film comprises:

a first film having the material with the permittivity higher than a permittivity of silicon oxide; and a second film disposed between the first film and the semiconductor layer.

10. The semiconductor device according to claim 9, wherein the second film is comprised of a material different than the material of the first film.

11. The semiconductor device according to claim 8, further comprising a silicide layer in contact with the p-type semiconductor film of the first gate electrode.

12. The semiconductor device according to claim 8, wherein a sidewall is formed over a side surface of the first gate electrode, and an offset spacer is between the side surface of the first gate electrode and the sidewall.

13. The semiconductor device according to claim 8, wherein a sidewall is formed over a side surface of the first gate electrode and comprises a first sidewall film and a second sidewall film, a first portion of the first sidewall film is disposed between the side surface of the first gate electrode and the second sidewall film, and a second portion of the first sidewall film is disposed between the second sidewall film and the semiconductor layer.

14. The semiconductor device according to claim 8, wherein the p-type semiconductor film of the first gate electrode is in direct contact with the second insulating film.

* * * * *